United States Patent
Ruach-Nir et al.

(10) Patent No.: US 11,049,704 B1
(45) Date of Patent: Jun. 29, 2021

(54) CLEANLINESS MONITOR AND A METHOD FOR MONITORING A CLEANLINESS OF A VACUUM CHAMBER

(71) Applicant: APPLIED MATERIALS ISRAEL LTD., Rehovot (IL)

(72) Inventors: Irit Ruach-Nir, Rehovot (IL); Michal Eilon, Beit-Elazari (IL); Guy Eytan, Kidron (IL); Magen Yaacov Schulman, Herzliya (IL); Sven Ruhle, Tel Aviv (IL); Manuel Radek, Aschaffenburg (IL); Igor Krivts (Krayvitz), Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 16/879,105

(22) Filed: May 20, 2020

(51) Int. Cl.
    *H01J 49/00* (2006.01)
    *H01J 49/04* (2006.01)
    *H01J 49/28* (2006.01)

(52) U.S. Cl.
    CPC ...... *H01J 49/0036* (2013.01); *H01J 49/0495* (2013.01); *H01J 49/28* (2013.01)

(58) Field of Classification Search
    CPC ........ H01J 37/18; H01J 49/0036; H01J 49/04; H01J 49/0409; H01J 49/0495; H01J 49/28; H01J 49/24
    See application file for complete search history.

(56) References Cited

U.S. PATENT DOCUMENTS

| | | | | |
|---|---|---|---|---|
| 5,271,264 A | * | 12/1993 | Chanayem | G01N 33/0009 73/28.01 |
| 10,217,621 B2 | | 2/2019 | Ruach-Nir et al. | |
| 2013/0199269 A1 | * | 8/2013 | Soers | G01N 30/06 73/23.41 |
| 2015/0198516 A1 | * | 7/2015 | Song | G01N 15/0606 73/572 |
| 2020/0013603 A1 | | 1/2020 | Ruach-Nir et al. | |

* cited by examiner

*Primary Examiner* — David E Smith
(74) *Attorney, Agent, or Firm* — Kilpatrick Townsend & Stockton LLP

(57) ABSTRACT

A cleanliness monitor, an evaluation system and a method. The cleanliness monitor may include: a first vacuum chamber, a second vacuum chamber, a molecule collector, a release unit, a mass spectrometer, a manipulator that may be configured to move the molecule collector from the first position to the second position, and an analyzer. The mass spectrometer may have a line of sight to an inner space of the second vacuum chamber. The mass spectrometer may be configured to monitor the inner space of the second vacuum chamber and to generate detection signals that are indicative of a content of the inner space of the second vacuum chamber. A first subset of the detection signals may be indicative of a presence of the at least subset of released organic molecules. The analyzer may be configured to determine, based on the detection signals, the cleanliness of at least one out of (a) the first vacuum chamber, and (b) a tested vacuum chamber. The tested vacuum chamber is fluidly coupled to the first vacuum chamber.

15 Claims, 5 Drawing Sheets

US 11,049,704 B1

CLEANLINESS MONITOR AND A METHOD FOR MONITORING A CLEANLINESS OF A VACUUM CHAMBER

BACKGROUND OF THE INVENTION

Molecular contamination is a fundamental issue in semiconductor manufacturing. Specifically in tools that include vacuum chambers, such as scanning electron microscopes.

Organic molecules may originate from organic component inside the vacuum chamber, as well as from wafers that were previously inserted into the vacuum chamber.

These organic molecules are absorbed on the surface of the inspected wafer and may form islands that cover fractions of the surface.

These island may result in wafer malfunctions.

The cleanliness level of a vacuum chamber may vary over time due to maintenance activities and the outgassing level of the inspected wafers.

There is a growing need to provide a cleanliness monitor and a method for monitoring the cleanliness of a vacuum chamber.

BRIEF SUMMARY OF THE INVENTION

A cleanliness monitor, an evaluation system, and a method as illustrated in the application.

According to some embodiments a cleanliness monitor includes: a first vacuum chamber, a second vacuum chamber, a mass spectrometer, a molecule collector, a release unit, a maniputlator and an analyzer. The molecule collector can be configured to aggregate, during an aggregation period and while positioned at a first position within the first vacuum chamber, organic molecules that are present in the first vacuum chamber to provide aggregated organic molecules. The release unit can be configured to induce, during a release period and while the collector is positioned at a second position within the second vacuum chamber, a release of at least a subset of the aggregated organic molecules towards the mass spectrometer to provide released organic molecules. The manipulator can be configured to move the molecule collector from the first position to the second position. The mass spectrometer can have a line of sight to an inner space of the second vacuum chamber and be configured to monitor the inner space of the second vacuum chamber and generate detection signals that are indicative of a content of the inner space of the second vacuum chamber where a first subset of the detection signals is indicative of a presence of the released organic molecules. The analyzer can be configured to determine, based on the detection signals, the cleanliness of at least one out of (a) the first vacuum chamber, and (b) a tested vacuum chamber that is fluidly coupled to the first vacuum chamber.

BRIEF DESCRIPTION OF THE DRAWINGS

The subject matter regarded as embodiments of the disclosure is particularly pointed out and distinctly claimed in the concluding portion of the specification. The embodiments of the disclosure however, both as to organization and method of operation, together with objects, features, and advantages thereof, may best be understood by reference to the following detailed description when read with the accompanying drawings in which:

DETAILED DESCRIPTION OF THE INVENTION

Figure 1:
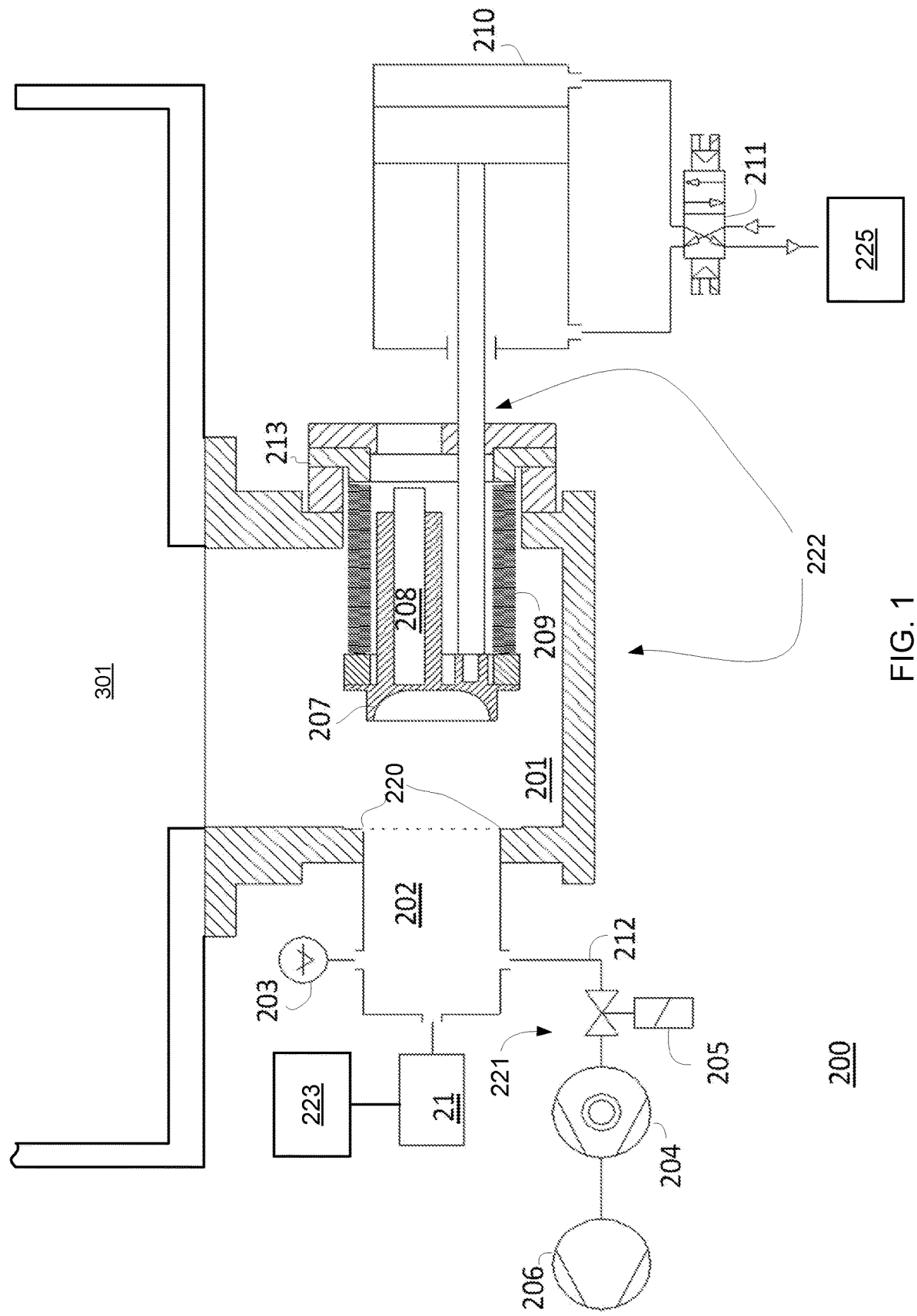
FIG. 1 illustrates an example of a cleanliness monitor.

In the following detailed description, numerous specific details are set forth in order to provide a thorough understanding of the embodiments of the disclosure. However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method.

Any reference in the specification to a system should be applied mutatis mutandis to a method that may be executed by the system.

Any reference to the term "comprising" or "having" should be interpreted also as referring to "consisting" of "essentially consisting of". For example, a method that comprises certain steps can include additional steps, can be limited to the certain steps or may include additional steps that do not materially affect the basic and novel characteristics of the method—respectively.

The phrase "within a vacuum chamber" and "within an inner space of a vacuum chamber" are used in an interchangeable manner.

There may be provided a cleanliness monitor. The cleanliness monitor may include a first vacuum chamber, a second vacuum chamber, a molecule collector, a release unit, a manipulator, a mass spectrometer, and an analyzer.

The molecule collector may be configured to aggregate, during an aggregation period and while positioned at a first position within the first vacuum chamber, organic molecules that are present in the first vacuum chamber. The organic molecules aggregated by the molecule collector are referred to as aggregated organic molecules.

The first vacuum chamber may be fluidly coupled to a tested vacuum chamber of an evaluation system.

The evaluation system may be an inspection system, a metrology system, a review system, and the like. The organic molecules within the first vacuum chamber may be emitted from the tested vacuum chamber. The tested vacuum chamber is tested in the sense that the cleanliness of the tested vacuum chamber is tested by the cleanliness monitor.

The release unit may be configured to induce, during a release period and while the collector is positioned at a second position within the second vacuum chamber, a release of at least a subset of the aggregated organic molecules towards the mass spectrometer. The at least one subset of the aggregated organic molecules are referred to as released organic molecules.

The manipulator may be is configured to move the molecule collector between the first position and the second position.

The mass spectrometer may have a line of sight to an inner space of the second vacuum chamber. The mass spectrometer may be configured to monitor the inner space of the second vacuum chamber and to generate detection signals that are indicative of a content of the inner space of the second vacuum chamber. A first subset of the detection signals may be indicative of a presence of the at least subset of the aggregated organic molecules.

The analyzer may be configured to determine the cleanliness of the first vacuum chamber based on the detection signals. Additionally or alternatively, the analyzer may be configured to determine the cleanliness of the tested vacuum chamber based on the detection signals.

The volume of an inner space of the first vacuum chamber may be larger than a volume of the inner space of the second vacuum chamber. For example, the volume of the inner space of the first vacuum chamber may be larger by at least a factor of 10, 20, 30, 40, 50, 60, 70, 80, 90, 100 (and even more) than a volume of the inner space of the second vacuum chamber.

The smaller volume of the inner space of the second vacuum chamber increases the sensitivity of the mass spectrometer because the concentration of the aggregated organic molecules in the inner space of the second vacuum chamber exceeds the concentration of the aggregated organic molecules in the inner space of the first vacuum chamber.

The release of the aggregated organic molecules is performed in the second vacuum chamber—and not in the first vacuum chamber—thereby increasing the cleanliness of the first vacuum chamber. The increment in the cleanliness of the first vacuum chamber may be more significant when the second vacuum chamber is isolated or at least is substantially isolated from the first vacuum chamber.

A separation between the first vacuum chamber and the second vacuum chamber during the release period also allows to allocate more time and/or more resources to the release period—as the release process does not contaminate the first vacuum chamber.

The separation between the first vacuum chamber and the second vacuum chamber, during the release period, may be achieved by using the molecule collector and the manipulator.

This may simplify system that includes the monitoring system and reduce the coast of manufacturing the system.

The manipulator may include a movement mechanism and bellows.

The movement mechanism may be configured to move the molecule collector between the first position and the second position.

The movement mechanism may be mechanically coupled between the molecule collector and the first vacuum chamber.

The movement mechanism may be any mechanical mechanism that is able to move the molecule collector between the first position and the second position. The movement mechanism may perform a liner movement, a non-linear movement, and the like. The movement mechanism may be a piston, a rotation unit, any combination of one or more motors, one or more gears, one or more joints, and the like.

The bellows may be configured to isolate the movement mechanism from the inner space of the first vacuum chamber at least during a movement between the first position and the second position. The isolation may prevent the contamination of the inner space of the first vacuum chamber by the movement mechanism.

The cleanliness monitor may include a flow control unit that may be configured to affect a propagation of the at least subset of the aggregated molecules during the release period.

After the release period the molecule collector may be moved within the inner space of the first vacuum chamber in order to perform another aggregation of organic molecules.

Because the first vacuum chamber is separated from the second vacuum chamber and because at least during the release period the pressure level within the second vacuum chamber may deviate from the pressure level of the first vacuum chamber—there is a need to equalize the pressure level of the second vacuum chamber to the pressure level of the first vacuum chamber—before moving the molecule collector back into the first molecule collector.

The flow control unit may be configured to compare a pressure within the inner space of the second vacuum chamber to the pressure within the inner space of the first vacuum chamber following an end of the release period.

The flow control unit may include a turbomolecular pump and a value. The valve may be configured to be closed during the monitoring period. The value may be configured to fluidly couple the inner space of the second vacuum chamber to the turbomolecular pump during at least a part of the release period. Any other combinations of flow control may be used.

The cleanliness monitor may include a first opening that may be shared by the first vacuum chamber and the second vacuum chamber. The manipulator may be configured to pass the molecule collector through the first opening while moving the molecule collector between the first position and the second position.

The cleanliness monitor may include a second opening that may be shared by the first vacuum chamber and the tested vacuum chamber.

The release unit may include a heating element that is thermally coupled to the molecule collector.

FIG. 1 illustrates an example of a cleanliness monitor 200.

The cleanliness monitor 200 may be used as stand-alone unit for monitoring and measurement of a cleanliness of equipment that operates within a tested vacuum chamber.

The cleanliness monitor 200 may include a first vacuum chamber 201 that may be fluidly coupled to a tested vacuum chamber 301.

A module (for example a metrology module, an inspection module, a defect review and the like) may be permanently or temporarily located with the tested vacuum chamber. The module may be a scanning electron microscope, a transmissive electron microscope, a critical dimension scanning electron microscope, a defect review scanning electron microscope, an ion miller, a charged particle imager, and the like.

The cleanliness monitor 200 may also include a second vacuum chamber 202, a molecule collector 207, a release unit, a manipulator 222, a mass spectrometer 21 and an analyzer 223.

The second vacuum chamber 202 may be mechanically coupled to the first vacuum chamber 201.

The release unit may include heater 208 and flow control unit 221.

The flow control unit 221 may include vacuum transducer 203, pumping line 212, turbomolecular pump 204, roughing pump 206, and valve 205.

FIG. 1 illustrates the molecule collector 207 at a first position within an inner space of the first vacuum chamber 201.

The molecule collector 207 may be moved by the manipulator 222. The manipulator 222 may include a movement mechanism such as a pneumatic cylinder 210 that is controlled by mechanical valve 211. The mechanical valve 211 may be controlled by control signals from controller 225.

Controller 225 may belong to the cleanliness monitor or may belong to the module.

Bellows 209 are mounted between molecule collector 207 and flange 213. Flange 213 is mounted on the interior of the first vacuum chamber 201. Flange 213 is an example of a mechanical element that mechanically coupled the bellows 209 to the first vacuum chamber 201.

Bellows 209 is configured to isolate the inner space of the first vacuum chamber 201 and the molecule collector 207 from the manipulator 222.

In FIG. 1 the heater 208 is mechanically coupled and thermally coupled to the molecule collector 207.

When positioned in the inner space of the first vacuum chamber 201, the molecule collector 207 is configured to aggregate organic molecules that are in the inner space of the first vacuum chamber 201. The organic molecules may originate from the tested vacuum chamber that is fluidly coupled to the first vacuum chamber.

The duration of the aggregation period may depend on an attachment period of the organic molecules. The attachment period may be measured or estimated. Different organic molecules may exhibit different attachment periods.

The duration of the aggregation period may be determined based on one or more attachment periods of one or more organic molecules.

For example, the duration of the aggregation period may be set based on the average attachment period of one or more organic molecules.

For example, the duration of the aggregation period may be set based on a weighted sum of one or more aggregation periods of one or more organic molecules.

For example, the duration of the aggregation period may be set based on an average attachment period of one or more organic molecules.

For example, the aggregation period may range between half an hour and a month, less than an hour, more than a month, and the like.

At the end of an aggregation period the controller may control the pneumatic cylinder 210 to move the molecule collector 207 to a second position within the inner space of the second vacuum chamber 202.

Figure 2:
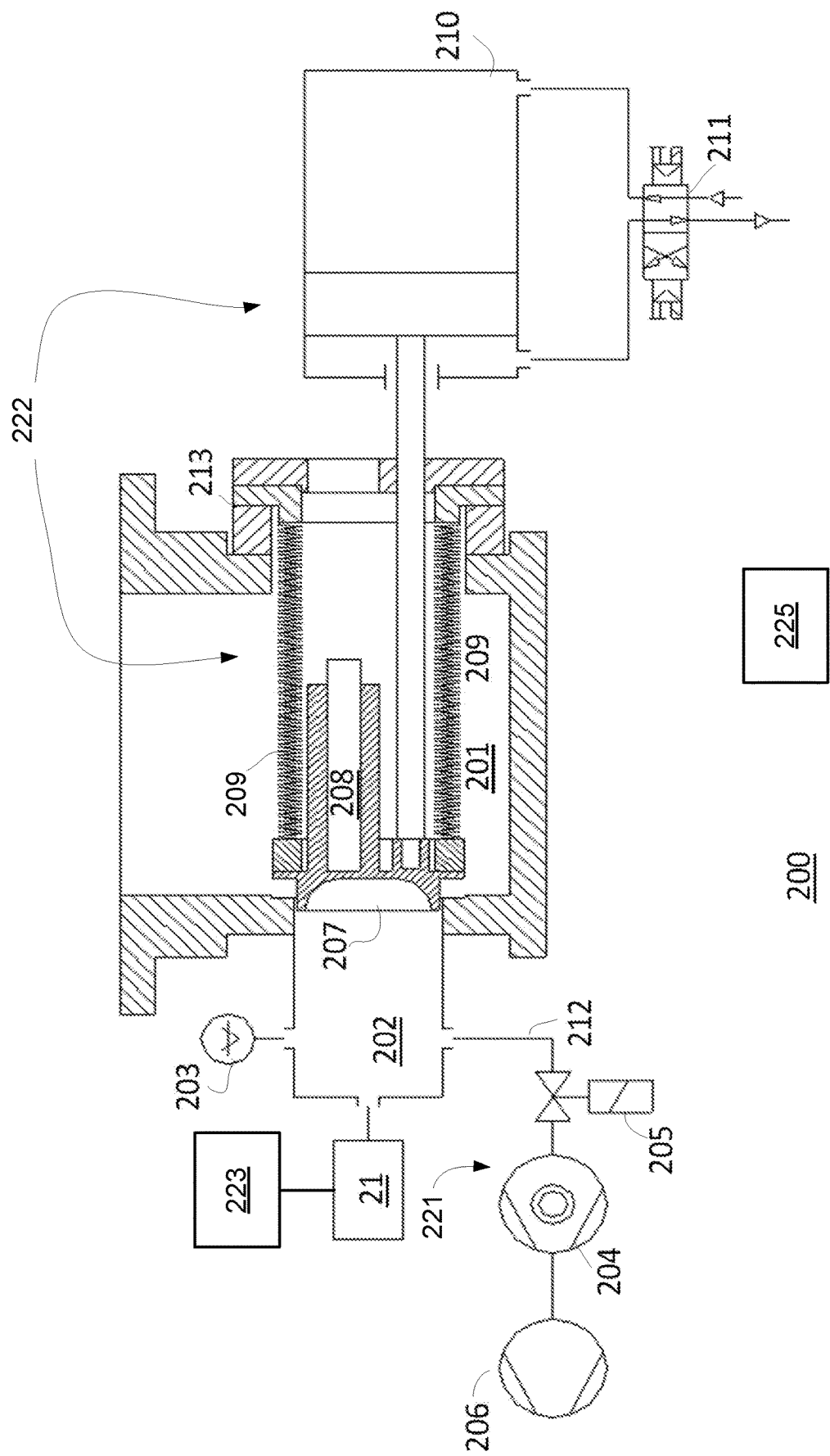
FIG. 2 illustrates an example of a cleanliness monitor.

FIG. 2 illustrates the molecule collector 207 as located at a second position within the inner space of the second vacuum chamber 202. The molecule collector 207 and the manipulator 222 separate the inner space of the first vacuum chamber from the inner space of the second vacuum chamber.

When the molecule collector 207 is located within the inner space of the second vacuum chamber 202, the release unit may perform a release process for releasing the aggregated organic molecules from the molecule collector 207. The released organic molecules are referred to as released organic molecules.

The release process of the aggregated organic molecules from the molecule collector 207 surface may include at least one out of (a) heating of the molecule collector 207 using heater 208, and (b) measuring the released molecules by the mass spectrometer.

The measurement may be followed by an evacuation of the released organic molecules from the second vacuum chamber 202. It may be beneficial to release the entire aggregated organic molecules from the molecule collector 207.

The duration of the release period may be significant shorter than the aggregation period and may depend on the surface temperature of the molecule collector 207, a concentration of the aggregated organic molecules on the surface, volume of the second vacuum chamber in the release position and the distance between molecule collector 207 and mass spectrometer 21.

During the release period, the pressure in the second vacuum chamber 202 may rise. The pressure in the second vacuum chamber 202 may be measured by a vacuum transducer 203. At the end of the measurement period the released organic molecules may be evacuated.

The evacuation of the released organic molecules may be completed before comparing the pressure level in the first vacuum chamber and the pressure level in the second vacuum chamber.

The evacuation of the released organic molecules may be executed in parallel to the comparing of the pressure level in the first vacuum chamber and the pressure level in the second vacuum chamber.

The comparison of the pressure level and/or the evacuation of the released organic molecules may be executed by flow control unit 221.

A valve 205 of the flow control unit 221 may fluidly couple a turbomolecular pump 204 of the flow control unit 221 with second vacuum chamber 202. The turbomolecular pump 204 may be configured to increase the vacuum level in the second vacuum chamber 202.

After the pressure within the second vacuum chamber is equal to the pressure within the first vacuum chamber, the pressure in the second vacuum chamber should be maintained for example by closing, by valve 205, the pumping line 212. In addition—the molecule collector 207 may be cooled by a cooling unit located within the space defined by bellows 209. The cooling of the molecule collector 207 may be followed by moving the molecule collector 207 to the first position.

The cleanliness monitor 200 may exhibit a high sensitivity to the organic molecules and may achieve a high purity of molecular contamination, since the released organic molecules are removed from the second vacuum chamber.

Figure 3:
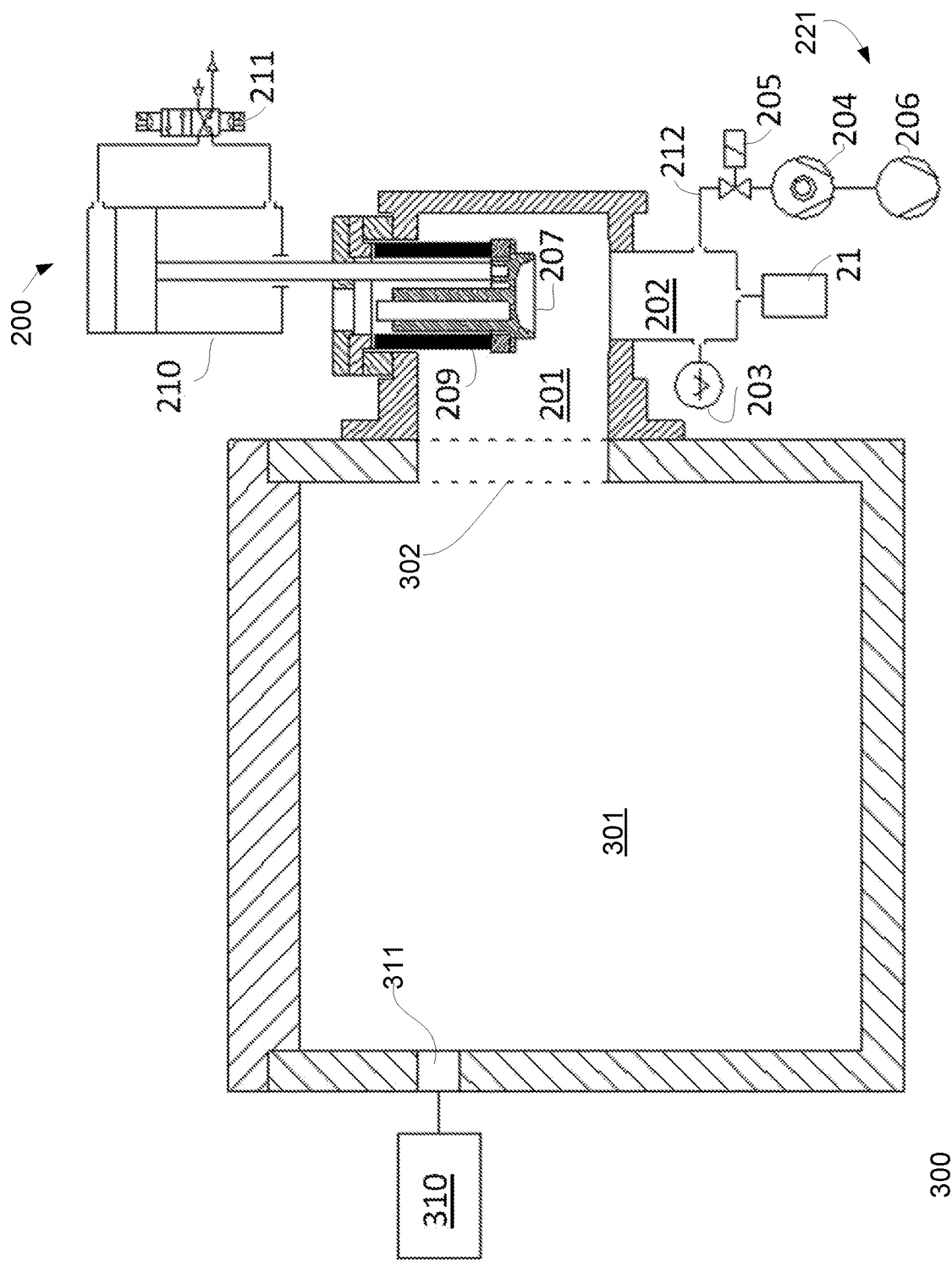
FIG. 3 illustrates an example of an evaluation system.
Figure 4:
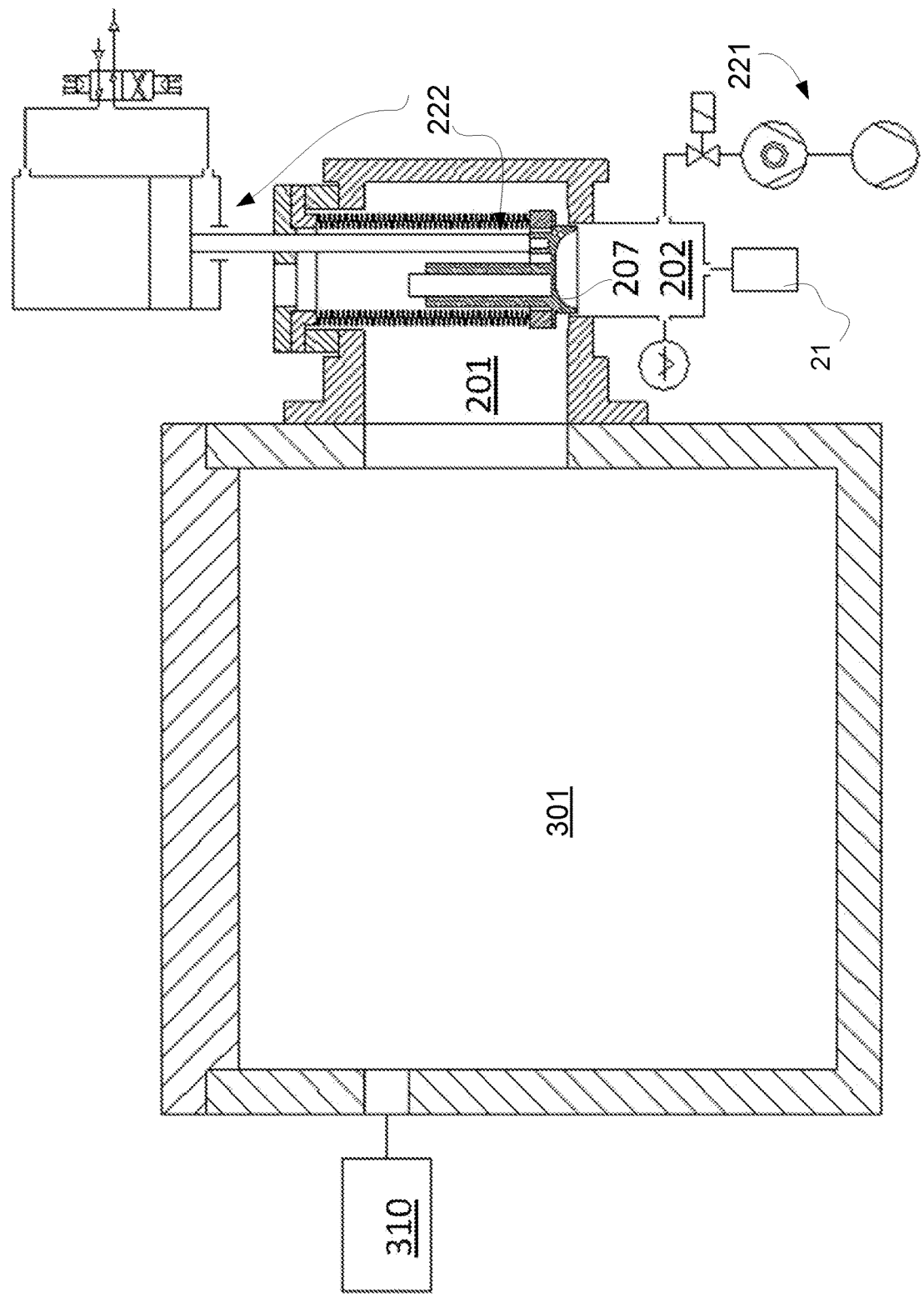
FIG. 4 illustrates an example of an evaluation system.

FIGS. 3 and 4 illustrate examples of an evaluation system 300 that includes a tested vacuum chamber 301 and cleanliness monitor 200.

A module such as but not limited an evaluation module (not shown) may be located within the tested vacuum chamber 301.

The first vacuum chamber 201 of the cleanliness monitor 200 is fluidly coupled to the tested vacuum chamber 301 via a second opening denoted 302 in FIG. 3. The first vacuum chamber 201 and the tested vacuum chamber 301 may be fluidly coupled to each other in any other manner.

In FIG. 3 the molecule collector 207 is at its first position.

In FIG. 4 the molecule collector is at its second position.

FIGS. 3 and 4 also illustrates a plasma source 310 that is configured to clean the tested vacuum chamber 301.

FIG. 4 illustrates that the manipulator 222 is configured to isolate the mass spectrometer 21 from the plasma and increase the lifespan of the mass spectrometer 21.

Figure 5:
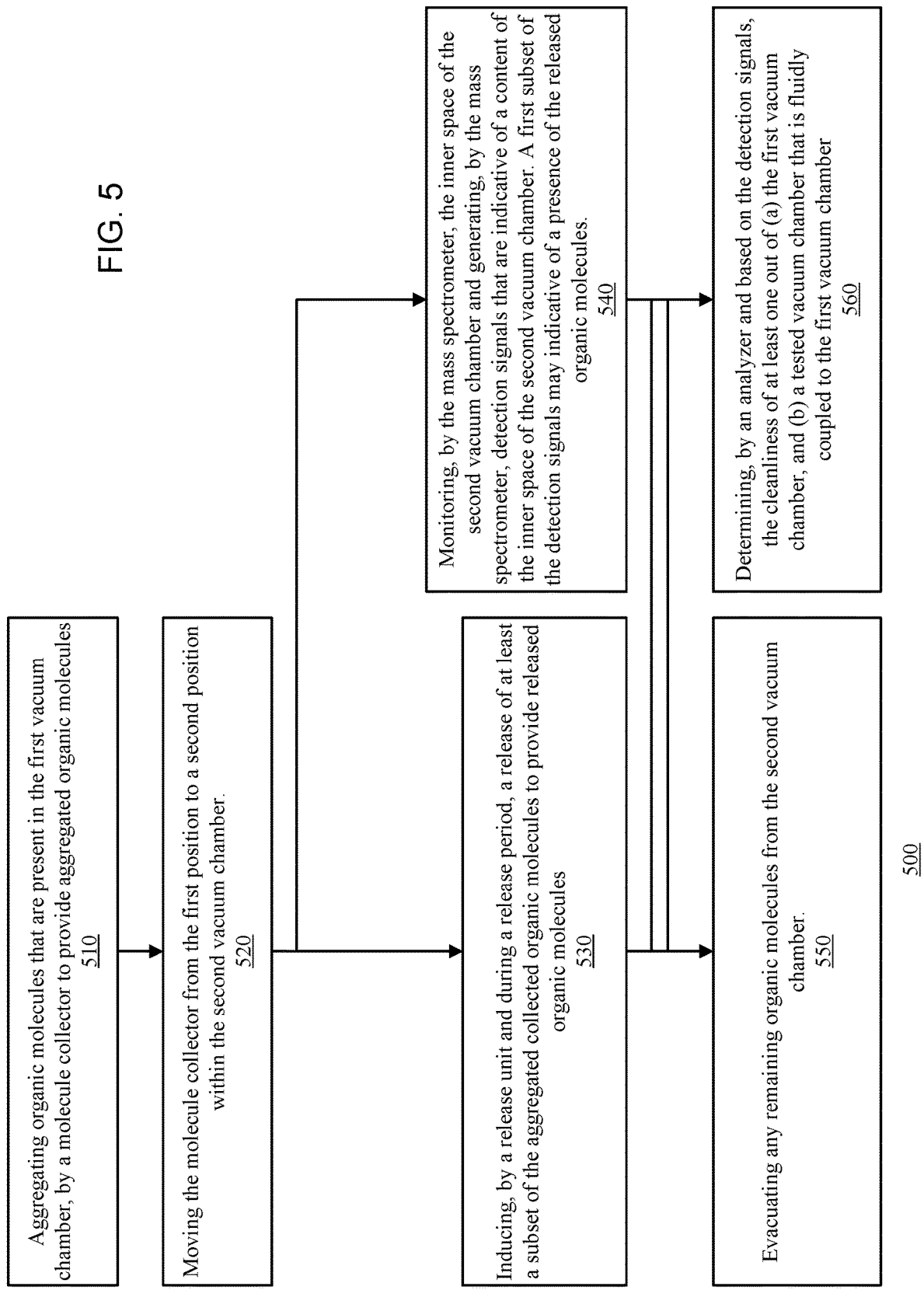
FIG. 5 illustrates an example of a method.

FIG. 5 illustrates a method 500 according to an embodiment of the disclosure.

Method 500 may start by step 510 of aggregating organic molecules that are present in the first vacuum chamber, by a molecule collector to provide aggregated organic molecules.

The aggregating of the organic molecule may be executed during an aggregation period and while the molecule collector is positioned at a first position within the first vacuum chamber. The first vacuum chamber may be fluidly coupled to a tested vacuum chamber and to a second vacuum chamber. The aggregation results in aggregated organic molecules.

Step 510 may be followed by step 520 of moving the molecule collector from the first position to a second position within the second vacuum chamber.

Step 520 may be followed by steps 530 and 540.

Step 530 may include inducing, by a release unit and during a release period, a release of at least a subset of the aggregated organic molecules to provide released organic molecules. The released organic molecules may be directed towards the mass spectrometer.

Step 540 may include monitoring, by the mass spectrometer, the inner space of the second vacuum chamber and to generating, by the mass spectrometer, detection signals that are indicative of a content of the inner space of the second vacuum chamber.

A first subset of the detection signals may indicative of a presence of the released organic molecules.

Steps 530 and 540 may be followed by steps 550 and 560.

Step 550 may include evacuating any released organic molecule from the second vacuum chamber.

Step 560 may include determining, by an analyzer and based on the detection signals, the cleanliness of at least one out of (a) the first vacuum chamber, and (b) a tested vacuum chamber that is fluidly coupled to the first vacuum chamber.

Step 560 may include comparing detection signals obtained during the aggregation period to detection signals obtained during the release period. The comparison may include comparing spectrum element that represent components of the same atomic weight.

The comparison may include comparing only spectrum components that have certain atomic weights—such as atomic weights of the organic molecules or of molecules that are generated as a result of the breaking of the organic molecule during the mass spectroscopy process.

Step 560 may include determining the cleanliness of the tested vacuum chamber based on the cleanliness of the first vacuum chamber. A relationship between the cleanliness of the first vacuum chamber and the cleanliness of the tested vacuum chamber may be calculated or tested in any manner.

For example, the relationship may be determined based on the manner that the first vacuum chamber and the cleanliness of the tested vacuum chamber are fluidly coupled to each other.

For example, the cleanliness of the first vacuum chamber can be measured multiple times and independently from measurements of the cleanliness of the tested vacuum chamber to provide multiple cleanliness results of both vacuum chambers. The relationship may be calculated based on the multiple cleanliness results of both vacuum chambers. Non limiting examples of calculations may include correlation, matching algorithms, and the like.

It is noted that method 500 may be repeated multiple times, in a periodic or non-periodic manner.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. A cleanliness monitor that comprises:
   a first vacuum chamber;
   a second vacuum chamber;
   a mass spectrometer having a line of sight to an inner space of the second vacuum chamber;
   a molecule collector that is configured to aggregate, during an aggregation period and while positioned at a first position within the first vacuum chamber, organic molecules that are present in the first vacuum chamber to provide aggregated organic molecules;
   a release unit that is configured to induce, during a release period and while the collector is positioned at a second position within the second vacuum chamber, a release of at least a subset of the aggregated organic molecules towards the mass spectrometer to provide released organic molecules;
   a manipulator that is configured to move the molecule collector from the first position to the second position; and
   wherein the mass spectrometer is configured to monitor the inner space of the second vacuum chamber and to generate detection signals that are indicative of a content of the inner space of the second vacuum chamber; wherein a first subset of the detection signals is indicative of a presence of the released organic molecules; and
   an analyzer that is configured to determine, based on the detection signals, the cleanliness of at least one out of (a) the first vacuum chamber, and (b) a tested vacuum chamber that is fluidly coupled to the first vacuum chamber.

2. The cleanliness monitor according to claim 1 wherein a volume of an inner space of the first vacuum chamber is larger than a volume of the inner space of the second vacuum chamber.

3. The cleanliness monitor according to claim 1 wherein a volume of an inner space of the first vacuum chamber is larger by at least a factor of ten than a volume of the inner space of the second vacuum chamber.

4. The cleanliness monitor according to claim 1 comprising a sealing unit that is configured to separate the first vacuum chamber from the second vacuum chamber while the collector is positioned within the second vacuum chamber.

5. The cleanliness monitor according to claim 1 wherein the manipulator is configured to separate the first vacuum chamber from the second vacuum chamber while the collector is positioned within the second vacuum chamber.

6. The cleanliness monitor according to claim 1 wherein the manipulator comprises (a) a movement mechanism that is mechanically coupled between the molecule collector and an inner space of the first vacuum chamber, and (b) bellows that are configured to isolate the movement mechanism from the inner space of the first vacuum chamber at least during a movement between the first position and the second position.

7. The cleanliness monitor according to claim 1 comprising a flow control unit that is configured to (i) affect a propagation of the released organic molecules during the release period, and (ii) compare a pressure within the inner space of the second vacuum chamber to a pressure within the inner space of the first vacuum chamber following an end of the release period.

8. The cleanliness monitor according to claim 1 comprising a flow control unit that comprises a turbomolecular pump and a value; wherein the valve is configured to be closed during the monitoring period; wherein the value is configured to fluidly couple the inner space of the second vacuum chamber to the turbomolecular pump during at least a part of the release period.

9. The cleanliness monitor according to claim 1 comprising an opening shared by the first vacuum chamber and the second vacuum chamber; wherein the manipulator is configured to pass the molecule collector through the opening while moving the molecule collector from the first position to the second position.

10. The cleanliness monitor according to claim 1 wherein the release unit comprises a heating element that is thermally coupled to a molecule aggregator of the molecule aggregator and releaser.

11. The cleanliness monitor according to claim 1 wherein the aggregation period is longer than the release period.

12. A method for cleanliness determination, the method comprising:
    aggregating organic molecules that are present in a first vacuum chamber, by a molecule collector to provide aggregated organic molecules, while the molecule collector is positioned at a first position within the first vacuum chamber; wherein the first vacuum chamber is fluidly coupled to the second vacuum chamber;
    moving the molecule collector from the first position to a second position within a second vacuum chamber;
    inducing, by a release unit and during a release period, a release of at least a subset of the aggregated organic molecules to provide released organic molecules;
    monitoring, by a mass spectrometer, an inner space of the second vacuum chamber;
    generating, by the mass spectrometer, detection signals that are indicative of a content of the inner space of the second vacuum chamber; wherein a first subset of the detection signals are indicative of a presence of the released organic molecules; and
    determining, by an analyzer and based on the detection signals, a cleanliness of at least one out of the first vacuum chamber and the tested vacuum chamber.

13. The method according to claim 12 wherein a volume of an inner space of the first vacuum chamber is larger than a volume of the inner space of the second vacuum chamber.

14. An evaluation system comprising:
    a tested vacuum chamber;
    an evaluation module that is configured to evaluate an object located in the tested vacuum chamber; and
    a cleanliness monitor that is configured to monitor a cleanliness of at least one of the tested vacuum chamber and a first vacuum chamber of the cleanliness monitor;
    wherein the cleanliness monitor further comprises:
    a second vacuum chamber;
    a mass spectrometer;

a molecule collector that is configured to aggregate, during an aggregation period and while positioned at a first position within the first vacuum chamber, organic molecules that are present in the first vacuum chamber to provide aggregated organic molecules;

a release unit that is configured to induce, during a release period and while the collector is positioned at a second position within the second vacuum chamber, a release of at least a subset of the aggregated organic molecules towards the mass spectrometer to provide released organic molecules;

a manipulator that is configured to move the molecule collector from the first position to the second position; and wherein the mass spectrometer has a line of sight to an inner space of the second vacuum chamber; wherein the mass spectrometer is configured to monitor the inner space of the second vacuum chamber and to generate detection signals that are indicative of a content of the inner space of the second vacuum chamber; wherein a first subset of the detection signals is indicative of a presence of the released organic molecules; and an analyzer that is configured to determine, based on the detection signals, the cleanliness of at least one out of (a) the first vacuum chamber, and (b) the tested vacuum chamber that is fluidly coupled to the first vacuum chamber.

15. The evaluation system according to claim 14 wherein a volume of an inner space of the first vacuum chamber is larger than a volume of the inner space of the second vacuum chamber.

* * * * *